(12) United States Patent
Perry et al.

(10) Patent No.: US 10,507,521 B2
(45) Date of Patent: Dec. 17, 2019

(54) MOULD FOR CASTING A MONOCRYSTALLINE COMPONENT

(71) Applicant: ROLLS-ROYCE PLC, London (GB)

(72) Inventors: Martin R Perry, Derby (GB); Kevin Goodwin, Derby (GB); Neil Dsouza, Derby (GB)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 15/477,769

(22) Filed: Apr. 3, 2017

(65) Prior Publication Data

US 2017/0320132 A1 Nov. 9, 2017

(30) Foreign Application Priority Data

May 3, 2016 (DE) .................................. 1607659.8

(51) Int. Cl.
*B22D 27/04* (2006.01)
*B22D 27/20* (2006.01)
*B22C 9/04* (2006.01)
*C30B 11/00* (2006.01)
*C30B 29/52* (2006.01)
(Continued)

(52) U.S. Cl.
CPC .............. *B22D 27/045* (2013.01); *B22C 9/04* (2013.01); *B22D 27/20* (2013.01); *C30B 11/002* (2013.01); *C30B 29/52* (2013.01); *B22C 9/00* (2013.01); *B22C 9/082* (2013.01); *B22C 9/22* (2013.01); *F05D 2230/21* (2013.01)

(58) Field of Classification Search
CPC ....... B22C 9/04; B22D 27/045; C30B 11/002; C30B 11/006
See application file for complete search history.

(56) References Cited

U.S. PATENT DOCUMENTS

| 3,536,121 A | 10/1970 | Piearcey et al. |
| 4,612,969 A * | 9/1986 | Burd .................... B22D 27/045 164/122.2 |
| 6,568,456 B1 * | 5/2003 | Fernihough ............. C30B 29/52 164/122.1 |

FOREIGN PATENT DOCUMENTS

| CN | 1796618 A | 7/2006 |
| EP | 1793020 A1 | 6/2007 |

OTHER PUBLICATIONS

N. D'Souza et al., "Morphological aspects of competitive grain growth during directional solidification of a nickel-base superalloy, CMSX4," Journal of Materials Science, vol. 37, 2002 pp. 481-487.
(Continued)

Primary Examiner — Kevin E Yoon
Assistant Examiner — Jacky Yuen
(74) Attorney, Agent, or Firm — Oliff PLC (57) ABSTRACT

A mould for casting a component in a directional solidification casting process having a preferred direction of grain growth (non-axial <001>) comprises a shell defining a cavity for receiving molten material. The cavity defines a three dimensional shape made up of a finished component geometry portion (42, 43, 44) and a sacrificial geometry portion (45) wherein the sacrificial geometry portion (45) includes a notch (48) which is shaped and positioned so as to, in use, contain high angle grain boundaries between dendritic growth in the preferred direction (non-axial <001>) and dendritic growth in a competing direction to the preferred direction (axial <001>) within the sacrificial geometry portion of a casting solidifying in the mould.

13 Claims, 6 Drawing Sheets

(51) Int. Cl.
  *B22C 9/00* (2006.01)
  *B22C 9/22* (2006.01)
  *B22C 9/08* (2006.01)

(56) References Cited

OTHER PUBLICATIONS

Sep. 4, 2017 Search Report issued in European Patent Application No. 17164502.1.
Oct. 18, 2016 Search Report issued in British Application No. 1607659.8.
N. D'Souza, et al., "Seeding of Single-Crystal Superalloys—Role of Constitutional Undercooling and Primary Dendrite Orientation on Stray-Grain Nucleation and Growth," Metallurgical and Materials Transactions B, vol. 36B, Oct. 2005 pp. 657-666.

* cited by examiner

MOULD FOR CASTING A MONOCRYSTALLINE COMPONENT

TECHNICAL FIELD

The present invention relates to casting of components where the microstructure of the component must be controlled to provide the desired mechanical properties for the component. More particularly (but not exclusively) the invention relates to moulds used in the casting of monocrystalline ("single crystal") components such as blades for gas turbine engines.

BACKGROUND OF THE INVENTION

It is well known in the field of gas turbine engines to cast components from metals and alloys using a process known as directional solidification. Directional solidification involves the controlled cooling of molten material in a mould to create a unidirectional grain structure and often a single crystal structure in the finished component. The term "single crystal" as used herein is intended to include castings with low angle grain boundaries where the crystal structure is maintained throughout the component.

Figure 1:
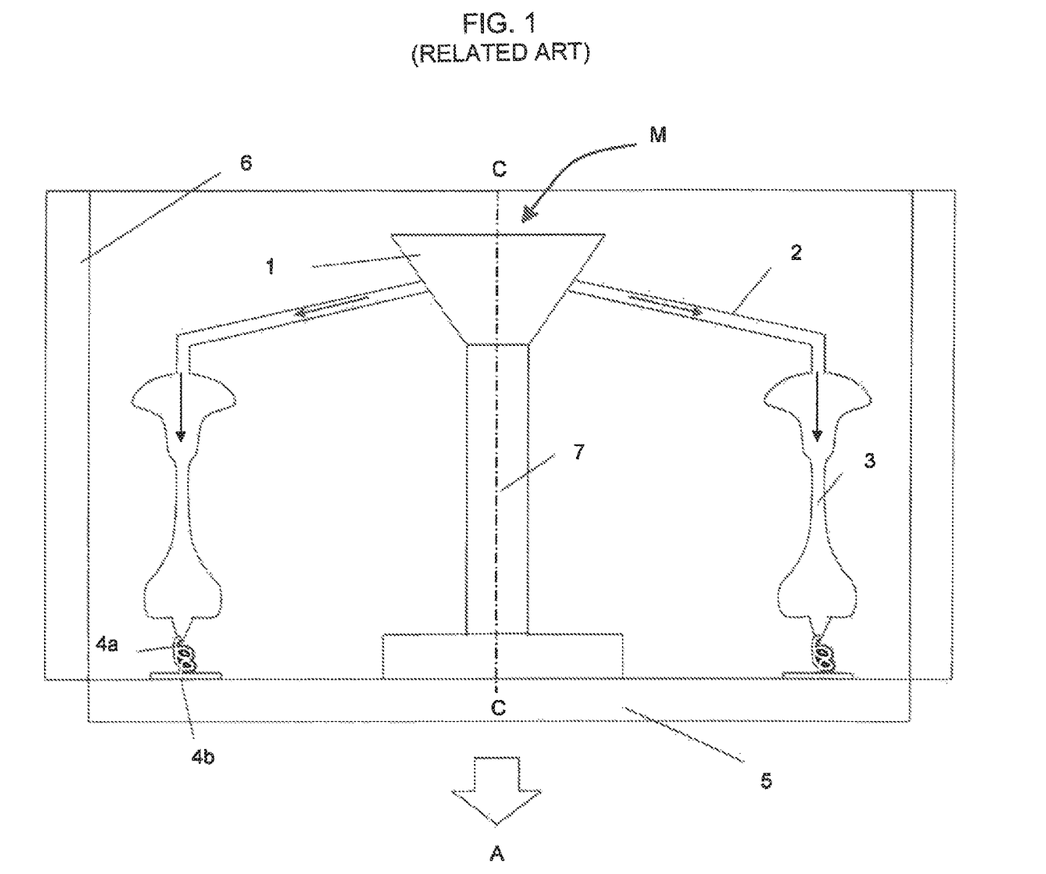
FIG. 1 shows a schematic of apparatus known to be used in the directional solidification casting of gas turbine engine parts.

FIG. 1 illustrates apparatus known to be used to perform directional solidification casting. The apparatus comprises a pouring cup 1 into which molten material M is poured. The pouring cup 1 sits on a cylindrical support column 7 having a centreline C-C. A plurality of feed channels 2 extend radially around the centrally arranged cup 1 to a top end of the moulds 3. Molten material M poured into the cup 1 flows along the feed channels 2 and into the moulds 3. Each mould 3 is provided with a grain selector 4a at a bottom end which terminates in a starter block 4b. The starter blocks 4b sit on a chill plate 5 which is maintained generally at a temperature below the melting point of the material M creating a temperature gradient from the bottom to the top of the moulds 3. During the pouring process, the moulds 3 are enclosed by a heat source 6 which encircles the cup 1 and the array of moulds 3. The assembly is drawn in a controlled manner out of the heat source 6 in the direction of arrow A to ensure directional solidification from the bottom of the moulds 3 to the top of the moulds 3. The combination of the grain selector 4a and starter 4b with controlled cooling encourages growth of a single crystal structure in the solidifying casting.

It will be appreciated that this is just one representative example. Other known apparatus include arrangements where the pouring cup is not at the centre of the mould array, feed channels which feed to regions of the mould other than the top and alternative methods for controlled cooling may be used, for example liquid metal cooling.

In many applications it is desirable to have grain growth in a direction which is inclined to the direction (Arrow A in FIG. 1) of cooling In such cases, crystal growth in terms of dendritic growth during solidification will converge upon a wall of the mould or diverge from the wall in respective converging and diverging dispositions. As differently directed dendrites approach each other, a dominant growth will tend to snuff out an opposing growth. Thus, it is desired to ensure that growth in the preferred direction is enabled to be dominant.

The Applicants own prior published patent no EP1793020 (B1) is more particularly directed to controlling the direction of dendritic growth where the preferred direction is inclined to the direction of cooling. Using apparatus broadly similar to that described, a seed crystal having the required directional dendritic growth is located in a sacrificial portion of the mould and is partially melted. Molten material is then added to the melted portion of the seed crystal to fill the mould. Directional cooling is applied as previously discussed. The method of EP1793020 (B1) dispenses with the previously used grain selector of a "pig-tail" design using only a selectively positioned and proportioned cylindrical tube grain selector between the seed and main body of the mould. Dendrites following the growth pattern of the unmelted seed crystal are filtered from those growing in conflict with this primary grain to provide the desired dominant grain structure in the solidified casting.

Whilst the method of EP1793020 (B1) is well suited for the purpose of blocking secondary grain growth in directions which compete with the primary grain growth, a further challenge arises. Thermal strains experienced by the primary dendrites as they grow through the grain selector can result in clumps of dendrites within the primary grain growth bending away from the initial direction of growth. The resulting misorientation can be up to 15° from the initial direction. This is accentuated for smaller diameters of the cylindrical tubes, typically 5 mm. Since the primary orientation in such seeded assemblies is typically inclined 15° to the vertical blade stacking axis, the bent cluster of dendrites can in some cases become the dominant growth direction if they align with the direction of the heat flux (arrow A in FIG. 1). They can consequently outgrow the initial off-axial primary <001> grain resulting in the formation of undesirable grain boundaries in the body of the cast component. Dendritic bending can occur prominently at sharply angled features of a mould geometry.

Cast components often undergo subsequent manufacturing operations before becoming a finished component. The cavity of the mould may define a geometry of a finished component and an additional sacrificial geometry which may be used in one or more subsequent manufacturing operations. The sacrificial geometry is removed when no longer needed for subsequent manufacturing operations leaving the finished component geometry. The sacrificial geometry may serve multiple functions, for example, it may be positioned to allow the cast component to be held securely during subsequent manufacturing processes. It is common for the sacrificial geometry to be provided at a bottom end of the mould (that is the relatively cooler end at which solidification commences). The integrity of a cast component can be improved if the occurrence of secondary growth dominance is restricted to the sacrificial geometry.

STATEMENT OF THE INVENTION

In accordance with the present invention there is provided a mould for casting a component in a directional solidification casting process having a preferred direction of dendritic growth <001> which is inclined to a direction Y of a thermal gradient, the mould comprising; a shell defining a cavity for receiving molten material, the cavity defining a three dimensional shape made up of a finished component geometry portion and a sacrificial geometry portion wherein the sacrificial geometry portion includes a notch which is shaped and positioned so as to, in use, contain the axial <001> dendritic growth direction, constituting the cluster of bent dendrites and different from the off-axial <001> primary orientation, within the sacrificial geometry portion of a casting solidifying in the mould.

In another aspect, the invention provides a method for casting a component in a directional solidification casting process having a preferred direction of dendritic growth <001> which is inclined to a direction Y of a thermal gradient, comprising; providing a mould having a shell defining a cavity for receiving molten material, the cavity defining a three dimensional shape made up of a finished component geometry portion and a sacrificial geometry portion, wherein the sacrificial geometry portion includes a notch which is shaped and positioned so as to, in use, contain dendritic growth in an axial direction <001>, different from the off-axial primary <001>, within the sacrificial geometry portion of a casting solidifying in the mould, introducing into the sacrificial geometry portion a seed crystal having a dominant growth direction of <001>, arranging the mould in a thermal gradient, the coolest end of the gradient being adjacent the sacrificial geometry portion, introducing molten material into the mould and gradually withdrawing the mould in a direction towards the coolest end whereby to control solidification of the material.

For example, the finished geometry portion defines the shape of a turbine blade or a compressor blade for a gas turbine engine. In this context the term "blade" is intended to include rotor blades and stator blades (sometimes referred to as guide vanes).

The notch preferably extends through an entire depth of the sacrificial geometry. For example, the notch has an apex A whose position in the direction Y corresponds to a maximum acceptable distance L up to which it is acceptable for the axial <001> dendrites to overgrow the primary off-axial <001> grain. For example the position of A in a direction orthogonal to direction Y is equal to the extent to which the axial <001> dendrites are present along a bounding wall of the sacrificial geometry. The notch meets a wall of the sacrificial geometry at two positions B and C, lines adjoining A to B and A to C defining the orientation of walls of the notch. Preferably, the position of at least one of B and C in the direction Y is larger than L. Optionally the position of both B and C in the direction Y is larger than L. Optionally the position of B or C in a direction L is zero, that is, a wall of the notch extends from the base wall to apex A.

The apex A may comprise a sharp angle or a rounded angle. The walls AB, AC may be substantially straight. Alternatively the walls may curve, for example in a manner which encourages dendrites to converge to a radius of the curvature.

The sacrificial geometry may define a holding element which is configured for securing the solidified casting during subsequent manufacturing operations. The holding element may include an aperture.

Irrespective of how carefully a temperature gradient from the bottom to the top of a solidifying casting is controlled, a chili zone will always develop adjacent walls of the mould creating solidification at a slower rate than is achieved through the length of solidifying casting. Dendrites will tend to grow in a direction substantially orthogonal to the mould wall surface. Where a wall is elongate and there is some distance between it and an opposing wall, a secondary grain structure growing in a direction other than the preferred direction may start to compete with a primary grain structure growing in the preferred direction. By breaking up these elongate wall surfaces with a notch, the direction of dendrite growth from the wall is turned either towards the preferred direction on in an opposite direction thereby significantly reducing the occurrence of secondary grain structures of a size to compete with the primary grain structure and more particularly, reducing the extension of such secondary grain structures into the finished component geometry.

Moulds for use in casting of metals and alloys are known to be made using a "lost pattern" or "lost wax" process. A low melting point material, for example wax, is shaped to form the desired shape of the component to be moulded. This wax model or "pattern" is then coated with a refractory material with a melting point higher than that of the metal or alloy to be cast. Typically the refractory material is a slurry containing particles of a ceramic material. Once applied to the pattern, the slurry is baked to form a hard shell around the pattern. The pattern can then be removed from the shell, for example by melting and pouring away. A cavity remains in the shell and defines the shape of the component to be moulded.

The notch may be incorporated into the pattern of a lost pattern manufacture of the mould resulting in the notch walls being integral with the mould walls. Alternatively, the notch may be provided by including an insert in a conventional mould, the insert being positioned adjacent a wall of the mould in the sacrificial geometry portion and having a shape which defines the notch in the mould cavity. For example, the insert is in the form of a wedge having an apex A and walls AB, AC, extending from the apex. The Apex A is positioned in alignment with the desired position of the apex A of the aforementioned notch. The material of the insert is selected such that it does not fuse or react with the molten material. For example, the insert comprises a ceramic, or has a ceramic coating. The ceramic or ceramic coating may comprise the same ceramic as the mould. The insert may be fastened to the mould. Alternatively the insert may be bonded to the mould.

Multiple notches may be provided in the sacrificial geometry portion.

The invention is well suited to casting of gas turbine engine components. Typically, the molten material used for casting such components is a Nickel alloy.

A benefit of the notch of the invention is that it can dispense with the need for a spiral "pig-tail" grain selector allowing a seed crystal to be deposited directly in the mould after the pattern has been removed. The absence of the grain selector results significantly in suppression of cracking of the mould during removal of the pattern and precludes subsequent mould repair operations, which can be a source of inclusions and stray grains nucleating from "repaired" regions that protrude within the mould shell.

BRIEF DESCRIPTION OF THE FIGURES

An embodiment of the invention will now be further described with reference to the accompanying Figures in which.

DETAILED DESCRIPTION OF THE FIGURES AND EMBODIMENTS

Figure 2:
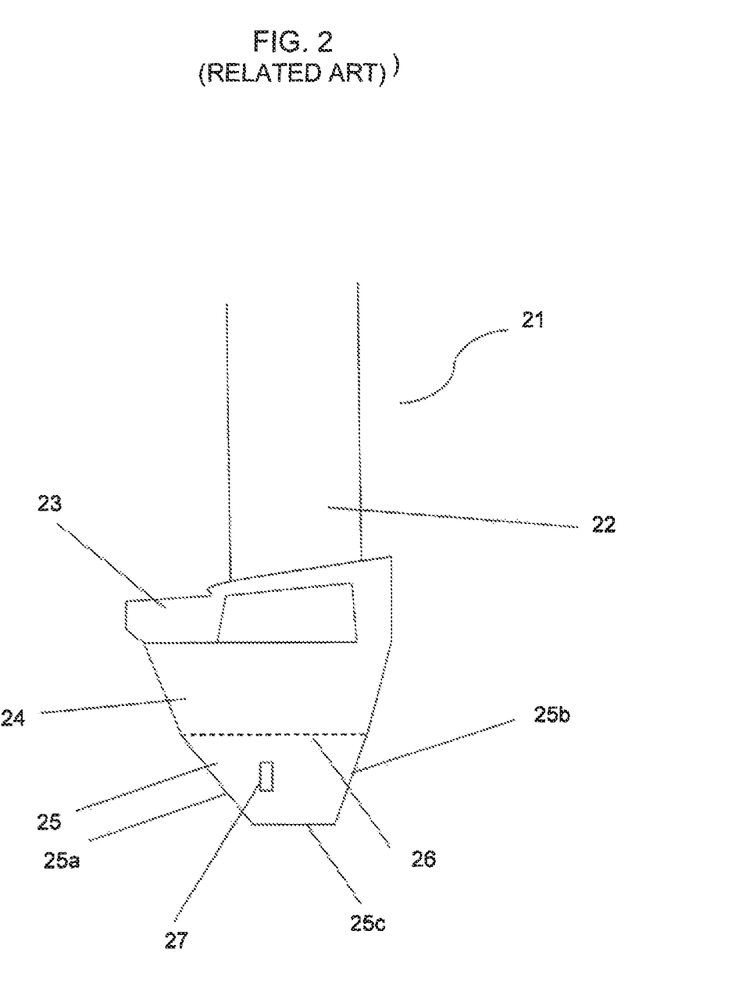
FIG. 2 shows a typical mould for the apparatus of FIG. 1.

FIG. 1 has already been described above. FIG. 2 shows a (partial) mould pattern 21 of a configuration known to be used in apparatus such as that of FIG. 1. The mould pattern 21 is for a turbine blade. For simplification the tip and shroud end of the mould are omitted. As can be seen the pattern comprises a blade aerofoil portion 22 extending from a hub portion 23 which sits on a root portion 24. Extending from the root portion 24 is a sacrificial geometry 25. The sacrificial portion 25 has two oppositely facing walls 25a and 25b both of which are planar and inclined to a planar base wall 25c. The sacrificial portion includes a slot 27 which may be used for holding a component cast from a mould made from the pattern 21. An interface between the sacrificial geometry 25 and the finished component geometry 24 is represented by dashed line 26. A mould made from the pattern 21 is positioned in the apparatus described in relation to FIG. 1 with the base wall corresponding to base wall 25c adjacent the chill plate 5 and substantially orthogonal to the direction of cooling. Thus dendrite growth is encouraged from the base wall towards the blade portion of the case component.

Figure 3:
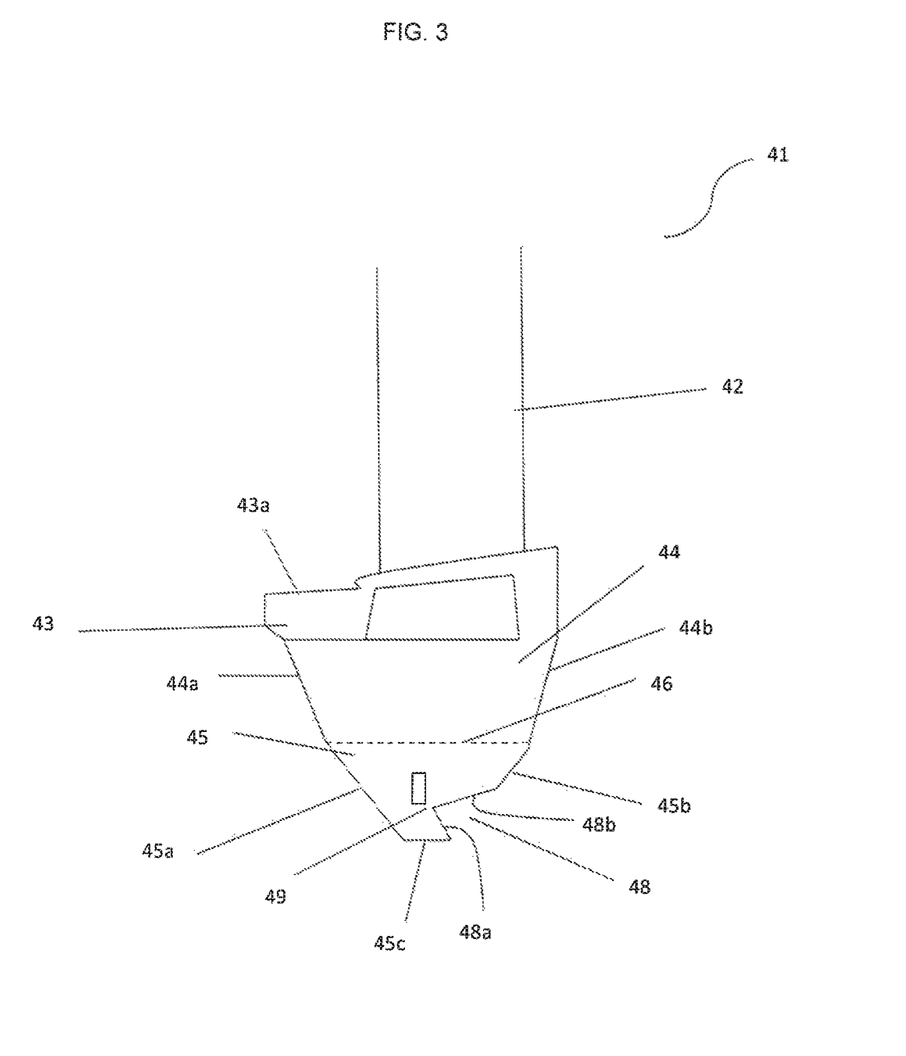
FIG. 3 shows a mould pattern in accordance with one embodiment of the invention.

FIG. 3 illustrates a pattern 41 for a mould for making a turbine blade, the blade having a substantially identical geometry as is intended by the pattern of FIG. 2. For simplification the tip and shroud end of the mould are omitted. As can be seen the pattern comprises a blade aerofoil portion 42 extending from a hub portion 43 which sits on a root portion 44. The hub portion has an upper facing wall 43a and the root portion has oppositely facing inclined walls 44a and 44b. Extending from the root portion 44 is a sacrificial geometry portion 45. The sacrificial geometry portion 45 has two oppositely facing walls 45a and 45b both of which are planar and inclined to a planar base wall 45c. The sacrificial portion includes a slot 48 which may be used for holding a component cast from a mould made from the pattern 41. An interface between the sacrificial geometry 45 and the finished component geometry 44 is represented by witness line 46. A mould made from the pattern 41 is positioned in the apparatus described in relation to FIG. 1 with the base wall corresponding to base wall 45c adjacent the chill plate 5 and substantially orthogonal to the direction of cooling. Thus dendrite growth is encouraged from the base wall towards the blade portion of the case component.

Figure 4:
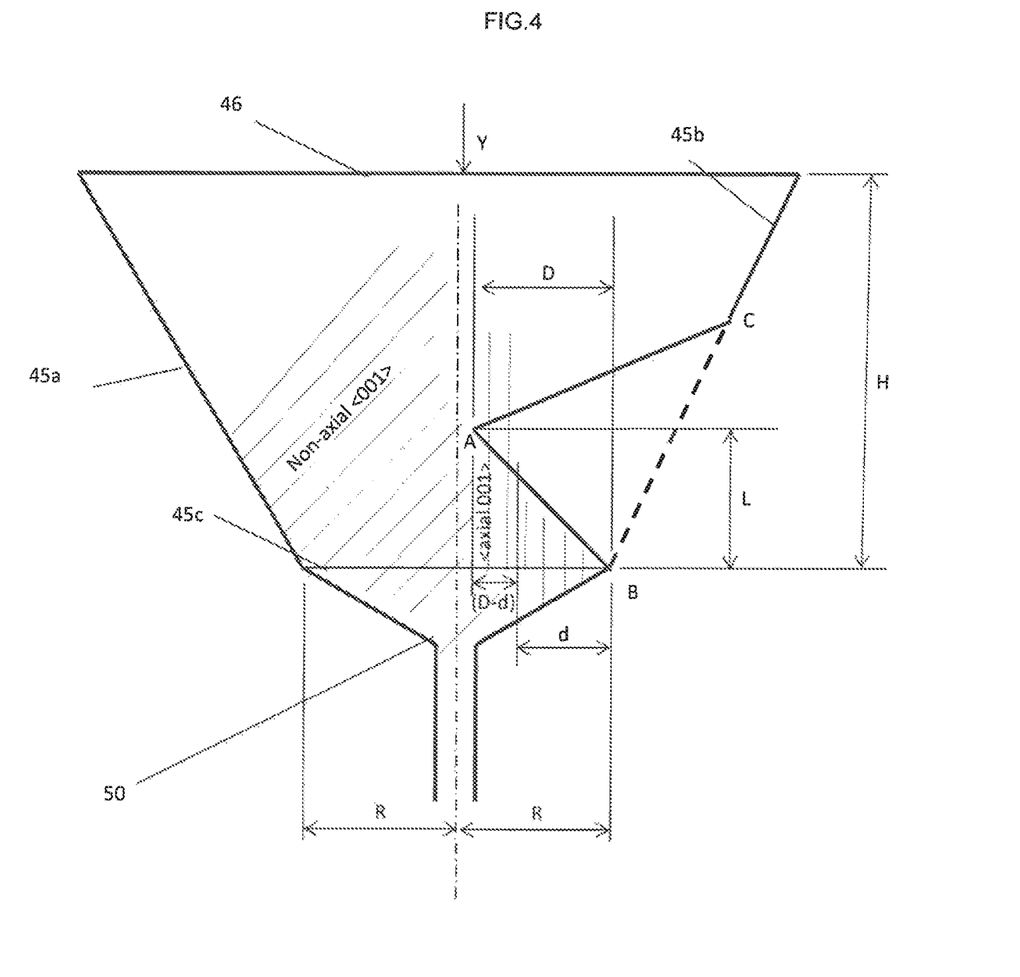
FIG. 4 illustrates how the geometry of the notch in accordance with the invention might be defined for a given investment casting process.

FIG. 4 shows a sacrificial portion of a casting similar to that of FIG. 3. The mould has a base wall 45c which extends from a grain selector 50. Above the grain selector 50, the sacrificial portion is defined by walls 45a, 45b and witness line 46 along which the finished casting will be machined to remove the sacrificial portion. The width of the base wall 45c is 2R and the witness line 46 is at a height H from the base wall 45c. The primary grain <001> has inclined dendrites growing from left to right in the picture at an inclination to the direction of cooling Y. For example the inclination is 15°.

In a worst case scenario dendritic bending in the grain selector 50 produces axial <001> dendrites which are perfectly aligned with respect to the direction of cooling Y. Since these axial <001> dendrites are aligned with Y, their growth will accelerate more quickly than the off-axial <001> dendrites which may quickly become overgrown (see FIG. 5).

By the time the axial <001> dendrites from the bent cluster reach the base wall 45c, they extend a distance d as shown. An acceptable maximum ingress of the secondary grain with axial <001>, D can be defined for a casting of known material, geometry and cooling conditions. Desirably to begin with, $d<\sim0.2$ (2R), that is, approximately 20% of the width of the base wall 45c (or less). An acceptable height L up to which it is acceptable for the axial <001> dendrites to overgrow the off-axial primary grain may also be identified, this height occurs when the ingress=D, that is when the axial <001> dendrites have grown a distance (D−d) into the off-axial <001> primary grain.

Figure 5:
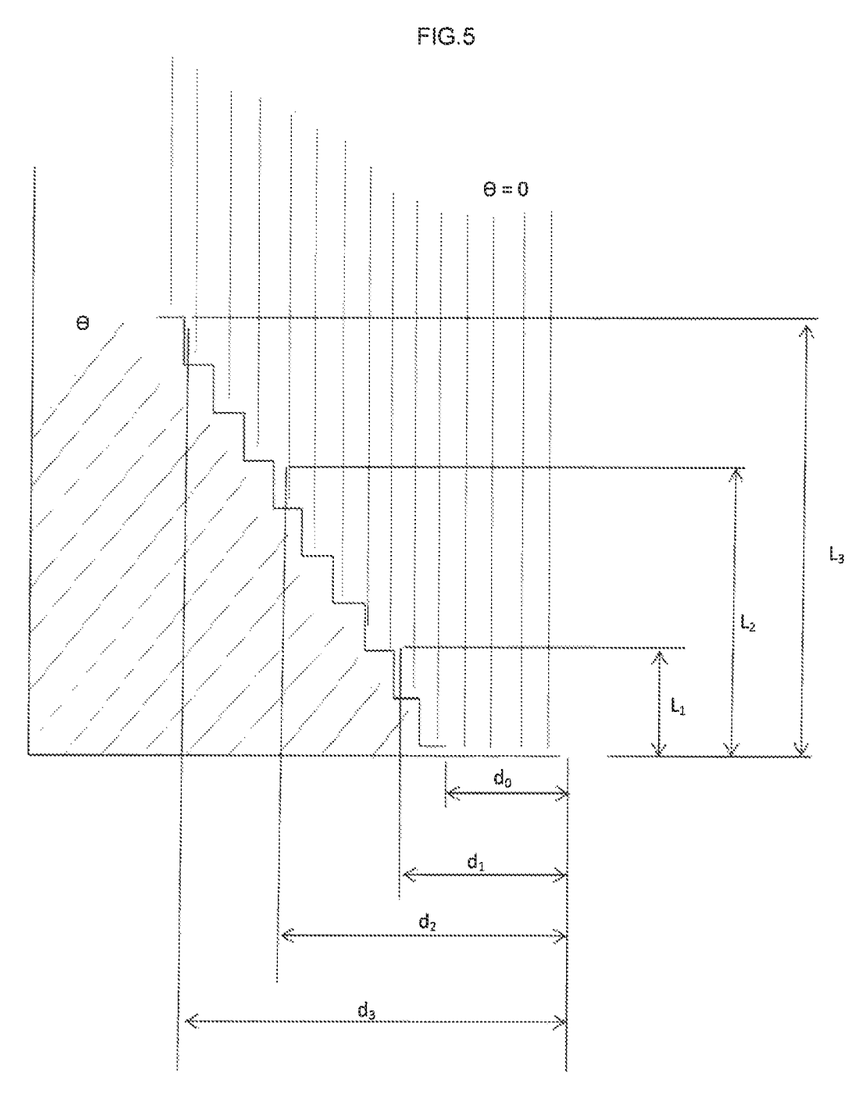
FIG. 5 illustrates how a bent cluster of axial <001> dendrites can overgrow the offs axial <001> dendrites comprising the primary grain.
Figure 6:
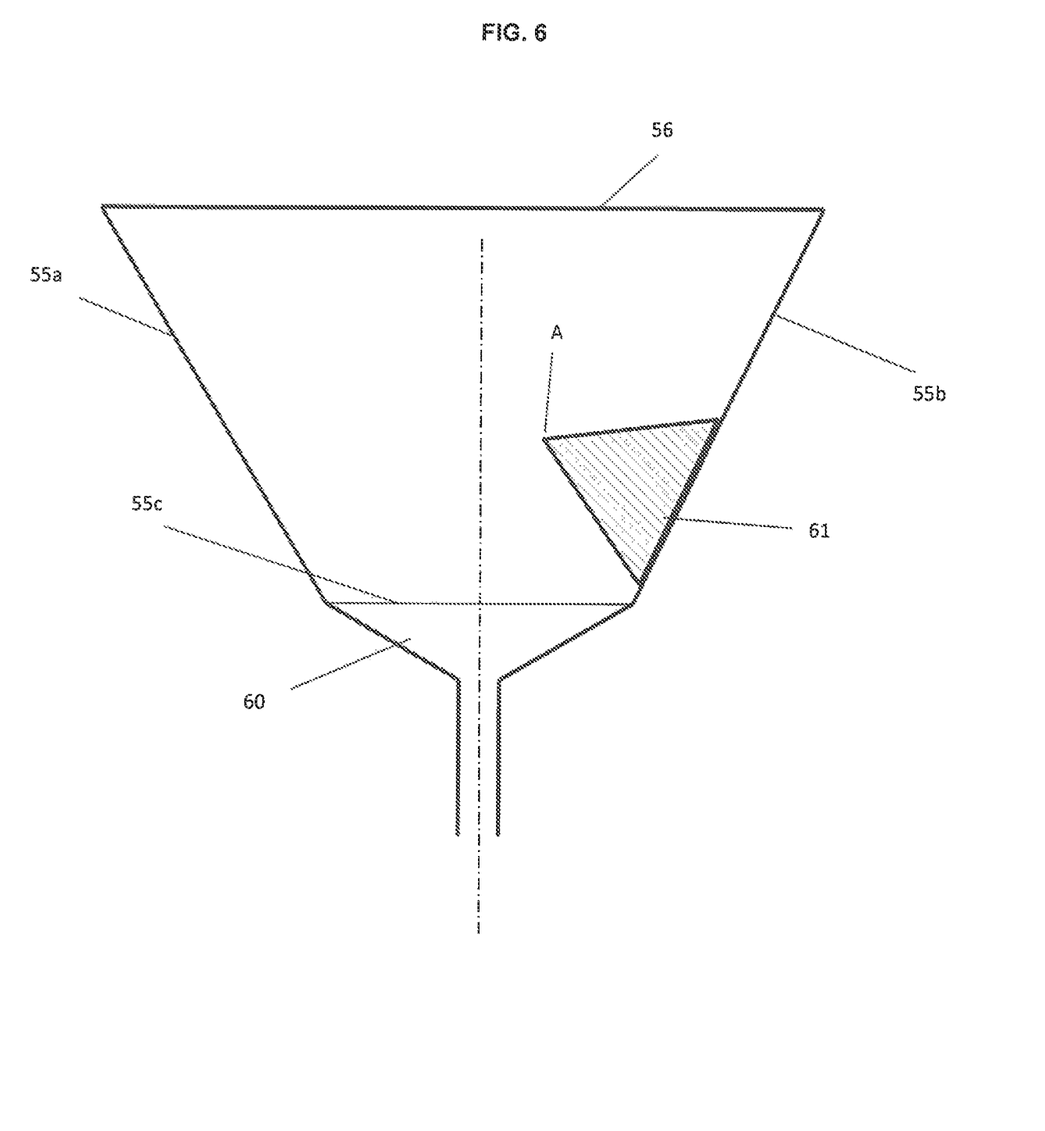
FIG. 6 illustrates an insert positioned in a mould as a means of defining a notch in accordance with the invention.

(D−d) can is dependent on L. For a given axial and off-axial <001> primary orientation, this value can be obtained either analytically from the dendrite tip growth kinetics using deterministic equations such, as in the KGT model (Kurz Giovanola Trivedi) or by a stochastic approach using the cellular automata approach finite element (CAFÉ) model or experimentally by conducting simple bi-crystal experiments (performed in Bridgman furnaces) as illustrated in FIG. 5. Here we begin with two seed crystals having the two chosen orientations corresponding to FIG. 4. By taking sections along the height for values of L; $L_1$, $L_2$, $L_3$ we can determine values for d; $d_0$, $d_1$, $d_2$, $d_3$ as shown in the figure.

In FIG. 4, line AB represents a wall of a notch configured to contain dendritic growth in the axial <001> direction. The positions of the points A and B between which a line defining the position and orientation of the wall may be determined from the identified values of D and L.

For any given value of L, say L=H/3 and an off-axial <001> orientation growing competitively with respect to an axial <001> orientation, we obtain (D−d), which is the extent to which the off-axial <001> primary grain is overgrown by the secondary <001> axial grain (from an analytical or bi-crystal method, as mentioned above). Knowing the initial spatial extent of the secondary grain at the base (45c), d and the subsequent ingress, (D−d), consequently D can be obtained. Thus knowing L (=H/3) and D, the position of the notch A can be obtained. The same argument can be used to determine AB at the opposite end, where in this case the dendrites of the primary grain form a diverging disposition. A similar bi-crystal experiment can be conducted, but in this case the dendrites diverge at the boundary. The rate of overgrowth will be different, i.e. for a given L~H/3, the corresponding (D−d) will be different compared with the converging case because of the orientation dependence on grain over growth (as demonstrated by D'Souza et al, Mater. Trans. B (2005) and Journal of Materials Science (2002)) for converging and diverging dispositions and accordingly this will give a different notch length AB.

Once the positions of AB are established, the length and orientation of AC can be arbitrary, so long as the wall AC meets the wall of mould 45b in FIG. 4.

As can be seen in FIG. 5, a sacrificial geometry portion of a mould is defined by walls 55a, 55b, 55c and witness line 56. A grain selector 60 extends beneath the sacrificial portion. A wedge shaped insert 61 is positioned in the sacrificial geometry portion with its apex A located at the desired position for an apex A of a notch to be formed in the sacrificial geometry portion. The insert 61 may, for example be secured to wall 55c by mechanical fasteners which might pass through the wall 55c, Alternatively, a bonding agent may be used to hold the insert in position against the wall 55c.

It will be understood that the invention is not strictly limited to the embodiments above-described. Except where mutually exclusive, any of the features may be employed separately or in combination with any other features and the disclosure extends to and includes all combinations and sub-combinations of one or more features described herein.

The invention claimed is:

1. A mould for casting a component in a directional solidification casting process having off-axial dendrites having a preferred direction of dendritic growth <001> which is inclined to a longitudinal direction Y of the mould and axial dendrites having a secondary direction of dendritic growth <001> different from the off-axial dendrites, the mould comprising:

a shell defining a cavity for receiving molten material, the cavity defining a three dimensional shape made up of a finished component geometry portion and a sacrificial geometry portion, wherein the sacrificial geometry portion includes a base wall and a notch configured to contain axial dendritic growth in the secondary direction of dendritic growth <001> within the sacrificial geometry portion of a casting solidifying in the mould, and the notch has an apex A in the sacrificial geometry portion disposed at a position from the base wall in the longitudinal direction Y corresponding to a maximum acceptable distance L up to which it is acceptable for the axial dendrites to overgrow the off-axial dendrites in the secondary direction of dendritic growth <001>.

2. The mould as claimed in claim 1 wherein the finished component geometry portion defines the shape of a turbine blade or a compressor blade for a gas turbine engine.

3. The mould as claimed in claim 1 wherein the notch extends through an entire depth of the sacrificial geometry portion.

4. The mould as claimed in claim 1 wherein the position of an Apex A of the notch in a direction orthogonal to the longitudinal direction Y is equal to the extent to which the axial dendrites are present along a bounding wall of the sacrificial geometry portion.

5. The mould as claimed in claim 1 wherein the notch meets a wall of the sacrificial geometry portion at two positions B and C, lines adjoining A to B and A to C defining the orientation of walls of the notch and the position of at least one of B and C in the longitudinal direction Y is larger than L.

6. The mould as claimed in claim 5 wherein the position of both B and C in the longitudinal direction Y is larger than L.

7. The mould as claimed in claim 5 wherein the position of one of B or C in a direction L is zero such that a wall of the notch extends from the base wall of the sacrificial geometry portion to the apex A.

8. The mould as claimed in claim 1 wherein the apex A comprises a sharp angle.

9. The mould as claimed in claim 5 wherein one or both of the walls AB, AC are straight.

10. The mould as claimed in claim 5 wherein one of the walls AB, BC is curved.

11. The mould as claimed in claim 1 wherein the notch is integrally formed into the mould.

12. A method for casting a component in a directional solidification casting process having off-axial dendrites having a preferred direction of dendritic growth <001> which is inclined to a longitudinal direction Y of the mould and axial dendrites having a secondary direction of dendritic growth <001> different from the primary off-axial dendrites, the method comprising:

providing a mould having a shell defining a cavity for receiving molten material, the cavity defining a three dimensional shape made up of a finished component geometry portion and a sacrificial geometry portion, the sacrificial geometry portion including a base wall and a notch configured to contain dendritic growth in the secondary direction of dendritic growth within the sacrificial geometry portion of a casting solidifying in the mould, the notch having an apex A in the sacrificial geometry portion disposed at a position from the base wall in the longitudinal direction Y corresponding to a maximum acceptable distance L up to which it is acceptable for the axial dendrites to overgrow the primary off-axial dendrites in the secondary direction of dendritic growth <001>;

introducing into the sacrificial geometry portion a seed crystal having a dominant growth direction of <001>;

arranging the mould in a thermal gradient, the coolest end of the gradient being adjacent the sacrificial geometry portion; and introducing molten material into the mould and gradually withdrawing the mould in a direction towards the coolest end whereby to control solidification of the material.

13. The method as claimed in claim 12 wherein the notch is provided in the form of an insert secured to an internal wall of the mould.

* * * * *